United States Patent
Paschkewitz et al.

(10) Patent No.: US 9,543,495 B2
(45) Date of Patent: Jan. 10, 2017

(54) METHOD FOR ROLL-TO-ROLL PRODUCTION OF FLEXIBLE, STRETCHY OBJECTS WITH INTEGRATED THERMOELECTRIC MODULES, ELECTRONICS AND HEAT DISSIPATION

(71) Applicant: PALO ALTO RESEARCH CENTER INCORPORATED, Palo Alto, CA (US)

(72) Inventors: John Steven Paschkewitz, San Carlos, CA (US); Corie Lynn Cobb, Mountain View, CA (US); David Mathew Johnson, San Francisco, CA (US); Gabriel Iftime, Dublin, CA (US); Victor Alfred Beck, Menlo Park, CA (US); Tse Nga Ng, Palo Alto, CA (US); Ranjeet Rao, Redwood City, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 14/581,542

(22) Filed: Dec. 23, 2014

(65) Prior Publication Data

US 2016/0181504 A1 Jun. 23, 2016

(51) Int. Cl.
| | | |
|---|---|---|
| *H01L 35/28* | (2006.01) |
| *H01L 35/34* | (2006.01) |
| *H01L 35/32* | (2006.01) |
| *H01L 35/30* | (2006.01) |
| *H01L 35/10* | (2006.01) |

(52) U.S. Cl.
CPC ............... *H01L 35/34* (2013.01); *H01L 35/10* (2013.01); *H01L 35/30* (2013.01); *H01L 35/32* (2013.01)

(58) Field of Classification Search
None
See application file for complete search history.

(56) References Cited

U.S. PATENT DOCUMENTS

| | | | |
|---|---|---|---|
| 3,554,815 A | 1/1971 | Otto |
| 3,649,829 A | 3/1972 | Randolph |
| 3,702,258 A | 11/1972 | Gibbons et al. |
| 4,222,059 A | 9/1980 | Crean et al. |
| 4,384,296 A | 5/1983 | Torpey |
| 5,270,086 A | 12/1993 | Hamlin |
| 6,576,861 B2 | 6/2003 | Sampath et al. |
| 6,934,142 B2 | 8/2005 | Grosse et al. |
| 7,083,830 B2 | 8/2006 | Minko |

(Continued)

FOREIGN PATENT DOCUMENTS

EP 2227834 B1 8/2011

OTHER PUBLICATIONS

McClure, Max, "Stanford Researchers' Cooling Glove Better than Steroids—and Helps Solve Physiological Mystery Too", Stanford Report, Aug. 29, 2012, 3 pages, retrieved from the Internet: http://news.stanford.edu/news/2012/august/cooling-glove-research-082912.html, retrieved on Dec. 19, 2014.

(Continued)

*Primary Examiner* — Reema Patel
(74) *Attorney, Agent, or Firm* — Marger Johnson (57) ABSTRACT

A method of forming a flexible thermal regulation device having multiple functional layers. The layers of the device are formed using various manufacturing techniques and are then integrated to form a sheet having multiple devices disposed thereon. The individual devices are then formed from the sheet.

14 Claims, 9 Drawing Sheets

(56) References Cited

U.S. PATENT DOCUMENTS

| | | | |
|---|---|---|---|
| 8,132,744 | B2 | 3/2012 | King et al. |
| 8,272,579 | B2 | 9/2012 | King et al. |
| 8,552,299 | B2 | 10/2013 | Rogers et al. |
| 8,742,246 | B2 | 6/2014 | Toyoda et al. |
| 2005/0000231 | A1 | 1/2005 | Lee |
| 2009/0014046 | A1 | 1/2009 | Yu et al. |
| 2009/0205696 | A1* | 8/2009 | Koester ............... H01L 23/38 136/201 |
| 2010/0154856 | A1 | 6/2010 | Yuichi et al. |
| 2011/0017431 | A1 | 1/2011 | Yang et al. |
| 2011/0150036 | A1 | 6/2011 | Lee et al. |
| 2011/0154558 | A1 | 6/2011 | Peter et al. |
| 2012/0227778 | A1 | 9/2012 | Leonov |
| 2013/0087180 | A1 | 4/2013 | Stark et al. |
| 2014/0146116 | A1 | 5/2014 | Paschkewitz |

OTHER PUBLICATIONS

Matheson, Rob, "Cool Invention Wins First Place at MADMEC", MIT News Office, Oct. 17, 2013, 3 pages, retrieved from the Internet: http://newsoffice.mit.edu/2013/madmec-design-competition-1017, retrieved on Dec. 19, 2014.

Vanhemert, Kyle, "MIT Wristband Could Make AC Obsolete", Wired.com, Oct. 30, 2013, retrieved from the Internet: http://www.wired.com/2013/10/an-ingenious-wristband-that-keeps-your-body-at-theperfect-temperature-no-ac-required/, retrieved on Dec. 19, 2014.

Francioso, L., "Flexible thermoelectric generator for ambient assisted living wearable biometric sensors", Journal of Power Sources, vol. 196, Issue 6, Mar. 15, 2011, pp. 3239-3243.

http://www.stacoolvest.com/, retrieved on Dec. 19, 2014.

http://www.steelevest.com/, retrieved on Dec. 19, 2014.

http://www.veskimo.com/, retrieved on Dec. 19, 2014.

http://www.glaciertek.com/, retrieved on Dec. 19, 2014.

http://www.cvs.com/shop/product-detail/CVS-Cold-Pain-Relief-Pack Reusable?skuld=324111, retrieved on Dec. 19, 2014.

Chen, A.,"Dispenser-printed planar thick-film thermoelectric energy generators," J. Micromech. Microeng., 21(10), 2011.

Hewitt, A.B., "Multilayered Carbon Nanotube/Polymer Composite Based Thermoelectric Fabrics," Nano Letters, 12 (3), pp. 1307-1310, 2012.

Arens, E., "Partial- and whole-body thermal sensation and comfort—Part I: Uniform environmental conditions," Journal of Thermal Biology, vol. 31, Issues 1-2, Jan. 2006, pp. 53-59.

Arens, E., "Partial- and whole-body thermal sensation and comfort—Part II: Non-uniform environmental conditions," Journal of Thermal Biology, vol. 31, Issues 1-2, Jan. 2006, pp. 60-66.

Bullis, Kevin, "Expandable Silicon", MIT Technology Review, Dec. 14, 2007, URL: http://www.technologyreview.com/news/409198/expandable-silicon/, retrieved from the Internet on Dec. 23, 2014.

"Ortho-Planar Spring", BYI Mechanical Engineering Website, URL: http://compliantmechanisms.byu.edu/content/ortho-planar-spring, retrieved from the Internet on Dec. 23, 2014.

Bhat, Pradeep P., "Formation of beads-on-a-string structures during break-up of viscoelastic filaments," Aug. 2010, vol. 6:625-631, Nature Physics, 7 pages.

Le, Hue P., "Progress and Trends in Ink-jet Printing Technology," Jan./Feb. 1998, vol. 42:49-62, Journal of Imaging Science and Technology, 16 pages, found at http://www.imaging.org/ist/resources/tutorials/inkjet.cfm.

Oliveira, Monica S., "Iterated Stretching, Extensional Rheology and Formation of Beads-on-a-String Structures in Polymer Solutions," Jan. 20, 2006, Special Issue of JNNFM on Extensional Flow, MIT, Cambridge, MA, 36 pages.

Owen, M., "Misting of non-Newtonian Liquids in Forward Roll Coating," Jul. 13, 2011, Journal of Non-Newtonian Fluid Mechanics, vol. 166:1123-1128, 6 pages.

Shi, X.D., "A Cascade of Structure in a Drop Falling from a Faucet," Jul. 8, 2004, vol. 265:219-222, Science, 4 pages.

Chapter 15, "Ink Jet Printing", 14 pages, found at http://www.lintech.org/comp-per/15INK.pdf.

Marple, A. and Liu, Y.H.: "Characteristics of Laminar Jet Impactors", Environmental Sciene & Technology, vol. 8, No. 7, Jul. 1974, pp. 648-654.

Bailey, Adrian G.: "The Science and technology of electrostatic powder spraying, transport and coating", Journal of Electrostatics, vol. 45, 1998, pp. 408-416, URL: http://www.ppsc-journal.com.

Kelly, Ryan T, et al.: "The ion funnel: theory, implementations, and applications", Mass Spectrometry Reviews, vol. 29, 2010, pp. 294-312.

Crowe, Clayton et al.: "Multiphase Flows With Droplets and Particles", CRC Press, LLC, 1198.

http://www.cvs.com/shop/product-detail/CVS-Cold-Pain-Relief-Pack-Reusable?skuId=324111, retrieved on Dec. 19, 2014.

Kim, S-J, et al: "A wearable thermoelectric generator fabricated on a glass fabric," Energy Environmental Science, 2014.

Francioso, L., et al: "Wearable and flexible thermoelectric generator with enhanced package," In Proc. SPIE 8763, Smart Sensors, Actuators, and MEMS VI, 876306, May 2013.

Huizenga, et al: "Skin and core temperature response to partial-and whole-body heating and cooling," Journal of Thermal Biology, vol. 29, Issues 7-8, Oct.-Dec. 2004, pp. 549-558.

Sholin, V. et al.: "High Work Function Materials for Source/Drain Contacts in Printed Polymer Thin Transistors," Applied Physics Letters, vol. 92, 2008.

Zhou, Li, et al: "Highly Conductive, Flexible, Polyurethane-Based Adhesives for Flexible and Printed Electronics," Advanced Functional Materials, vol. 23, p. 1459-1465, wileyonlinelibrary.com.

\* cited by examiner

METHOD FOR ROLL-TO-ROLL PRODUCTION OF FLEXIBLE, STRETCHY OBJECTS WITH INTEGRATED THERMOELECTRIC MODULES, ELECTRONICS AND HEAT DISSIPATION

BACKGROUND

Humans are acutely attuned to changes in their surrounding temperature and often seek means to make themselves more thermally comfortable. This modification may be accomplished by modifying the temperature of the surrounding atmosphere, like HVAC systems, or by applying a thermal regulation device, such as an icepack, to the user themselves. The use of personal thermoregulation devices allows a user to hopefully achieve a desired level of thermal comfort without interfering with those around them. Additionally, it may be more economical and desirable to allow a user to adjust their own thermal comfort, as each person's thermal tolerance varies.

Currently, many of the device used in personal active thermoregulation, such as "cool vests" and "cool gloves" are bulky and cumbersome. Often they impede the movement and abilities of the user while the devices are in-use. Additionally, these device contain moving parts such as pumps, combined with the typically intricate design of these devices, the manufacturing process is necessarily complex. The intricacy of the manufacturing process and the multi-component nature of these devices increase their cost.

Another method used for personal passive thermoregulation are gel-packs and other devices which can be pre-chilled and then placed against a user's skin to lower their body temperature. There is a compromise with these devices, as they are used they eventually thermally equalize with the user's or environmental temperature. As the temperature differential between the user and device lessens, the efficacy declines.

There is a need for a more compact personal thermoregulation device having simplified and scalable manufacturing.

SUMMARY OF THE INVENTION

Methods of producing a flexible device having active thermal regulation capabilities are disclosed. The manufacturing method includes forming thermoelectric elements and electrically interconnecting the elements in a functionally graded material to form a thermal energy transfer layer. A thermal exchange layer is then formed and integrated with the thermal energy transfer layer. When used, the thermoelectric elements of the device add or extract thermal energy from a user. The extracted thermal energy is then transferred to the thermal exchange layer where the thermal energy is dissipated into the environment.

DETAILED DESCRIPTION

Figure 1:
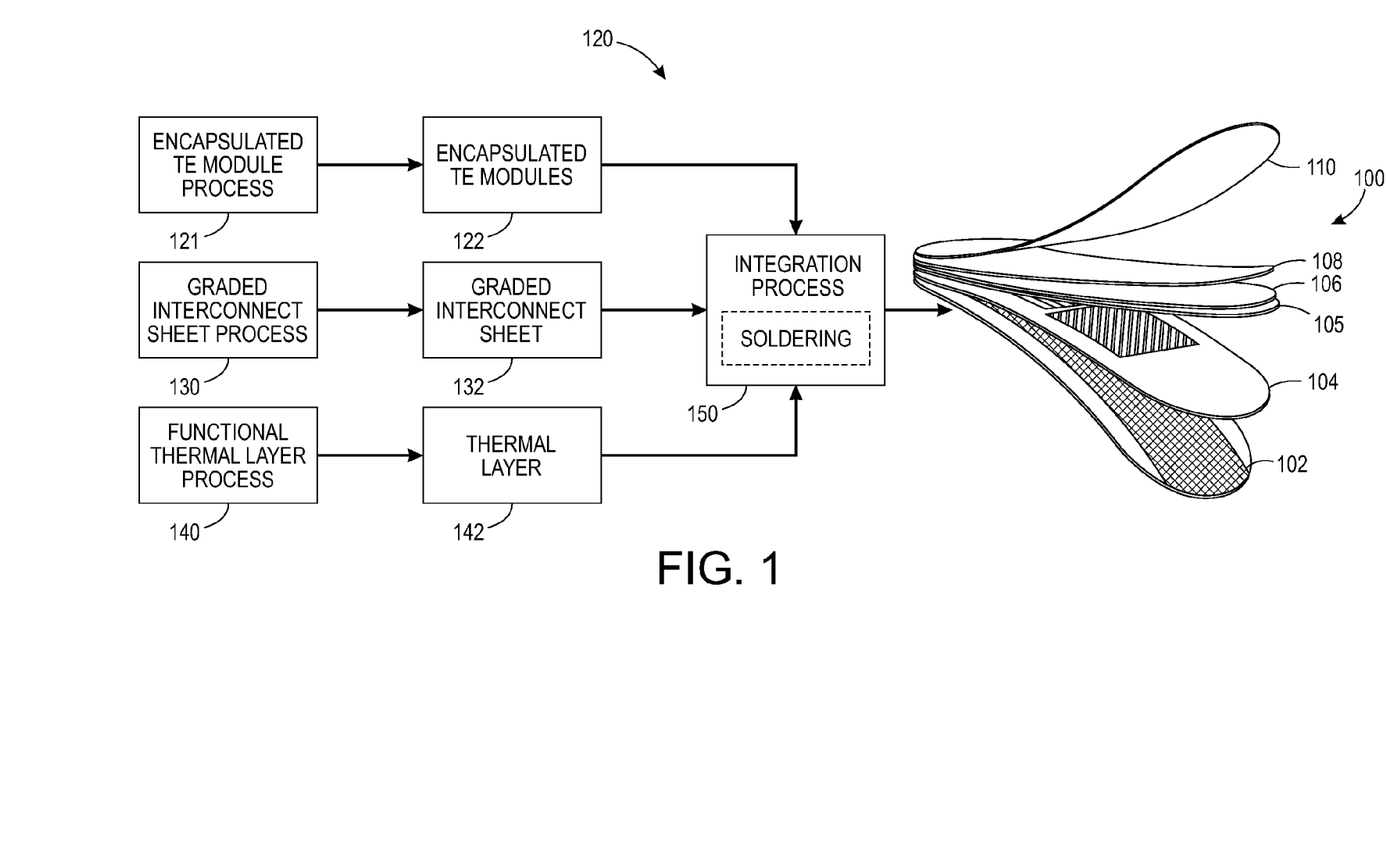
FIG. 1 details an example process used to produce the invention.

An example process of creating the flexible thermoregulation device 100 is shown in FIG. 1. The device 100 is composed of multiple layers, including an adhesive layer 102, a thermal energy transfer layer 104, a layer of interconnects 105, a thermal energy spreading layer 106, a thermal energy exchange layer 108 and a protective layer 110.

An example process 120 used to create thermoelectric elements encapsulated in a functionally graded material is is also shown in FIG. 1. Encapsulated thermoelectric modules 122 are created using an encapsulated thermoelectric module process 121. A graded interconnect sheet 132 is created using a process 130. At least one thermal layer 142 is created using a functional thermal layer process 140. An integrating process 150 is then used to integrate the elements 122, 132, 142 and the other layers to form the completed device 100. Possible integration processes 150 include soldering the multiple layers of the device together or bonding using adhesive or heat. An example of a soldering method is the use of room temperature solder that is dispensed to create connections between various layers. Other suitable integration processes that to do not damage the components may be used to bond the various layers of the device 100 together.

The processes used to form the various layers of the device 100 may be adapted so that each layer is formed as a roll of material. Using roll-to-roll manufacturing, the various layers may be rolled out, bonded and then cut or punched out to form the device 100.

The device 100 contains thermoelectric elements that actively cool or heat the user. The thermoelectric elements use the Peltier Effect to affect temperature change. The Peltier Effect occurs when current is passed through a junction between two different conductors. The flow of current causes the junction to either gain or lose heat depending on the directions of the current flow. Two conductors, an n-type and a p-type, are in contact with each other, and current is passed through them. As the current flows through the conductor pair, so does the heat, as one side of the conductor pair cools down and the other side heats up.

The thermoelectric element conductors can be composed of thermoelectric material such as Bismuth chalcogenides and others. Multiple conductors can be arranged thermally in parallel and/or electrically connected in series to increase their thermal capabilities. Thermoelectrics do not have any moving parts. Therefore, maintenance is minimal and the working life span of such devices is extended.

Functionally graded material is a material that has varying mechanical properties across its dimensions. In the case of the device 100, the functionally graded material has varying strain properties, meaning that the stiffness or rigidity of the material is varied. The functionally graded material surrounds the rigid thermoelectric elements to form a matrix that is stiffer around the thermoelectric elements and gradually gets less so away from the thermoelectric elements. The mechanical properties of the functionally graded material are capable of being modified to desired levels during the manufacturing process.

The coordinated use of functionally graded and flexible material in the device design and manufacture create selected locations of zero or near zero strain throughout the device in all three dimensions. Components can be placed at the zero strain sites without risk of damage from induced strain in the device. As the device flexes or bends, the strain induced in the device is mitigated at these zero strain points, such that the strain does not impact or affect the component.

Figure 2:
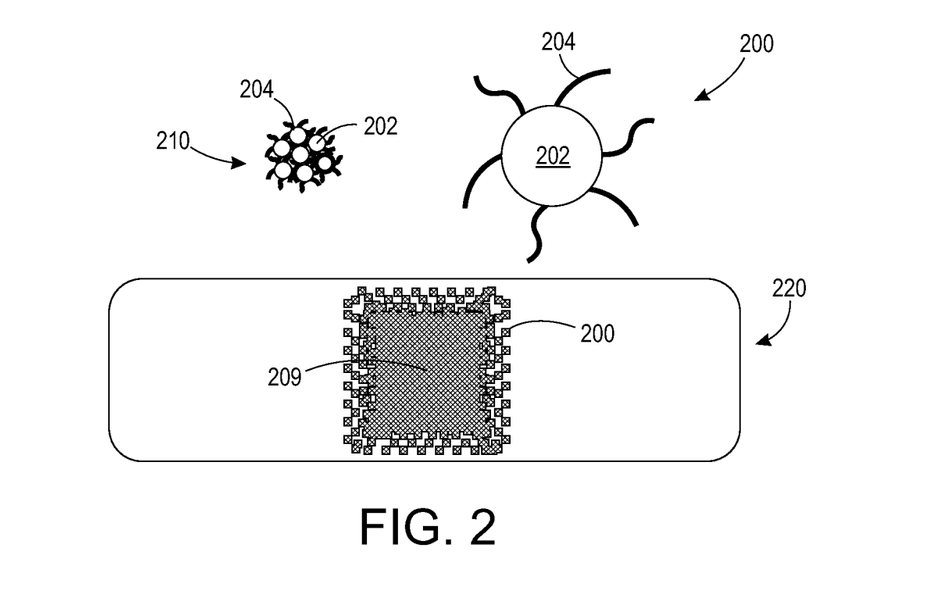
FIG. 2 details an example thermoelectric elements and their placement on the device.

FIG. 2 illustrates a thermoelectric unit 200 composed of the thermoelectric element 202 and polymers 204. The polymers 204 may be a functionally graded material that is graded to have varying mechanical properties, such as the Young's Modulus, across its length. A group 210 of dense thermoelectric units 200 is composed of multiple thermoelectric elements 202 joined together by a polymer 204. The thermoelectric units 200 are disposed on the device 220 in varying density. In the example illustrated, the density of the thermoelectric units 200 is concentrated at the center 209 of the device and decreases as they move out from the center.

Figure 3A:
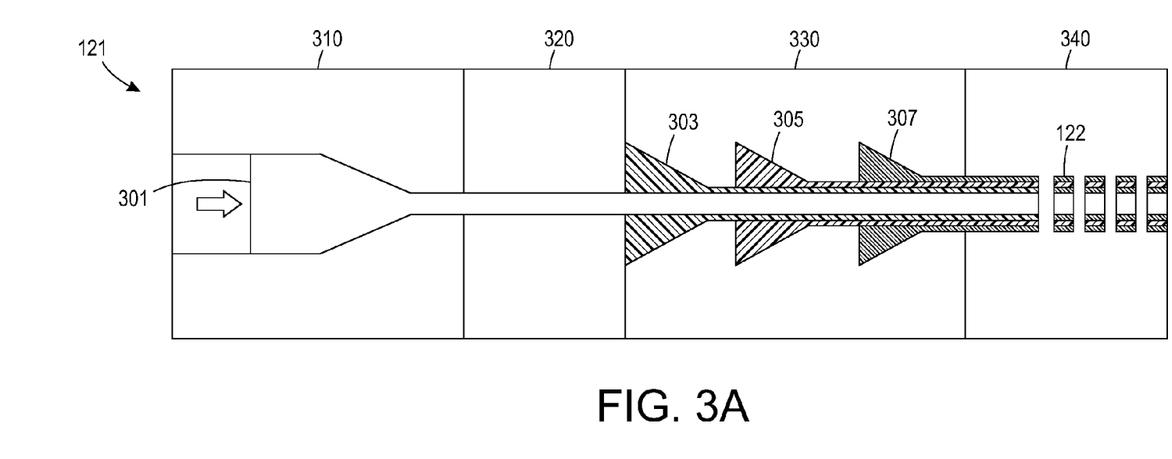
FIG. 3A details an example process of creating the thermoelectric elements.

A process 122, of FIG. 1, for creating the thermoelectric elements encapsulated in functionally graded material is shown in FIG. 3A. The thermoelectric material 301 is melted and extruded in a step 310. In the example shown, the thermoelectric material 301 is a ceramic doped to be either a p- or n-type conductor. The extruded thermoelectric material is then cooled into a rod in step 320. The cooled thermoelectric material is then coated in functionally graded material in step 330. In the example shown, the thermoelectric material is coated in three layers of material, 303, 305 and 307, each layer having differing mechanical properties. Alternatively, more or less layers may be applied as necessary. In the step 340, the coated thermoelectric rod is sliced into rounds to form encapsulated thermoelectric elements 122. The elements 122 are p- or n-type thermoelectric conductors coated in functionally graded material.

The elements 122 may be extruded in alternate shapes as necessary. The use of alternate shapes may assist when packing the elements 122 together. Alternatively, the elements 122 may be a mix of various shapes.

Figure 3B:
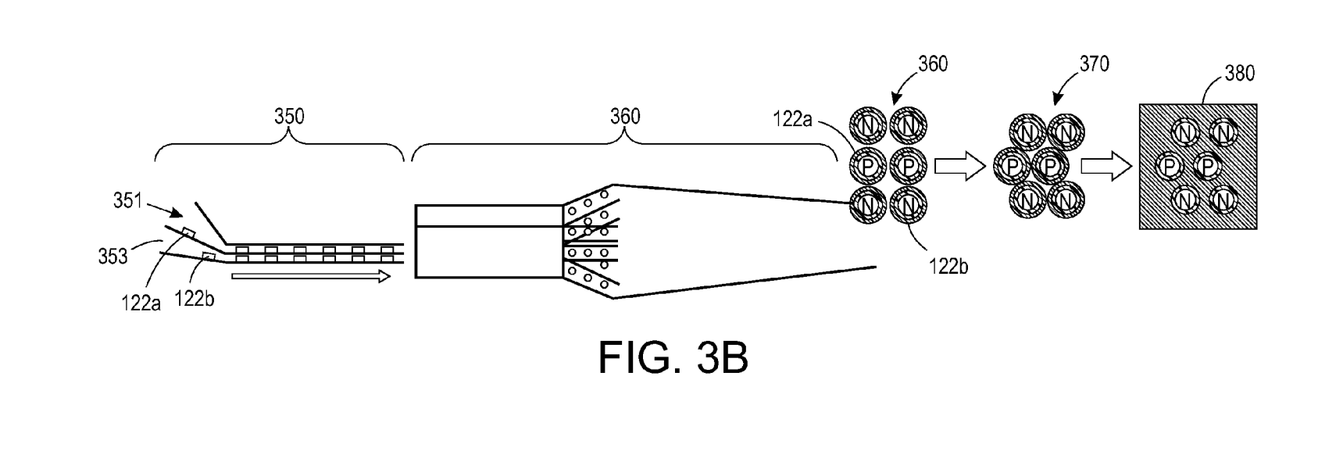
FIG. 3B. details an example process to arrange the thermoelectric elements.

The elements 122 are then fed into the layout process shown in FIG. 3B. The coated p-type elements 122a are fed on a conveyor 351 and the coated n-type elements 122b are fed on a conveyor 353 in the step 350. The coated p- and n-type elements 122a and 122b are interleaved in a machine 362 during the step 360. The interleaving of the coated elements 122a and 122b creates an array of thermoelectric elements 362. In the step 370, the thermoelectric elements are densified, i.e, they are packed into a denser arrangement. The densely packed array of thermoelectric elements is then surrounded by functionally graded material 382 in the step 380 to create a sheet of thermoelectric elements in a functionally graded material matrix. The thermoelectric elements are arrayed in the desired pattern and are held in this arrangement by the functionally graded material.

The process of arranging the thermoelectric elements 122 in functionally graded material 382 may be adapted to a larger scale manufacturing process. The functionally graded material with the elements 122 disposed therein may form a sheet. The sheet has repeated groupings of the thermoelectric elements. The sheet can then be rolled and used in the integration process, combining multiple layers of device materials, to manufacture the devices.

Alternatively, the elements, 122a and 122b, may bypass the steps shown in FIG. 3B and instead be manually or automatically placed in the locations as desired. A pick and place machine may be used to quickly and accurately place the thermoelectric elements in the desired locations.

Figure 4:
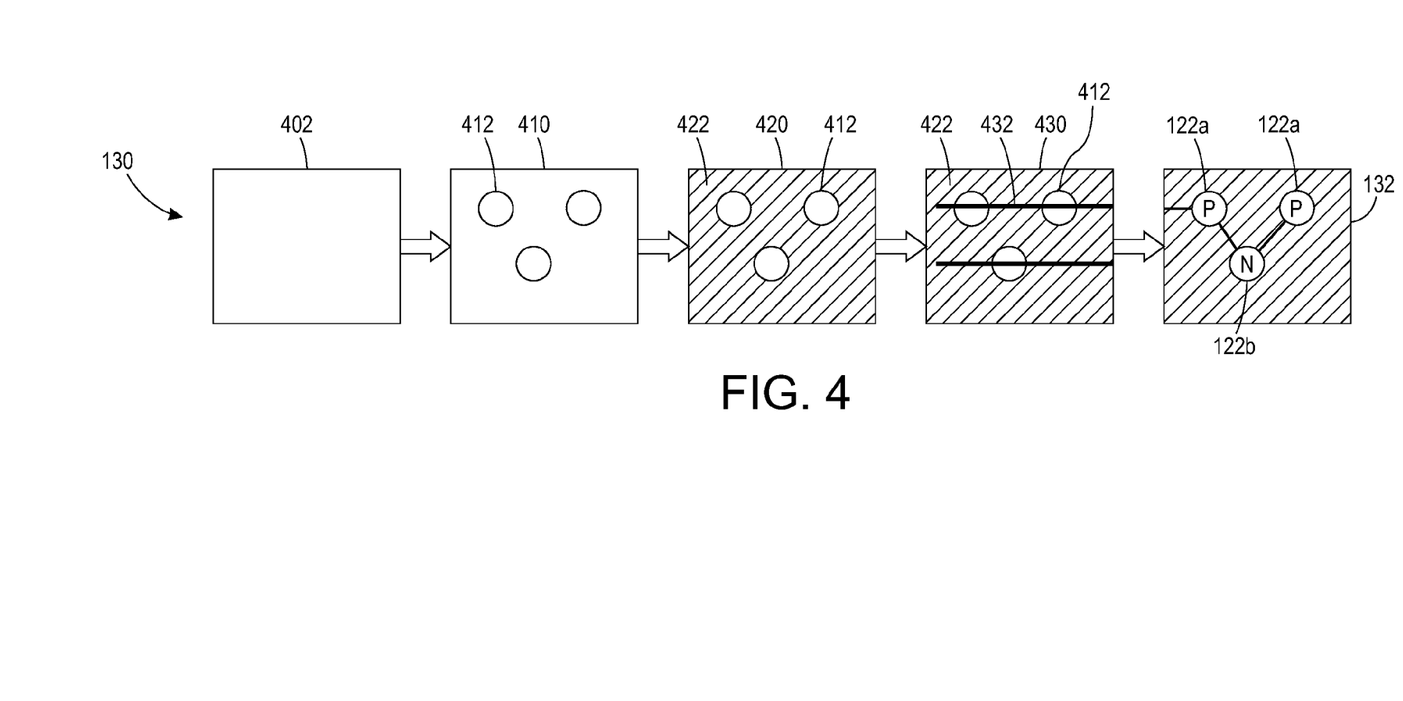
FIG. 4 details an example process of creating the graded interconnect sheet.

The thermoelectric elements 122 are placed on a graded interconnect sheet 132 that bonds and electrically connects the bases of each of the elements 122. An example process 130 for creating the graded interconnect sheet 132 is shown in FIG. 4.

In a first step 402, a flexible polymer base 404 is constructed. The base 404 may be constructed of functionally graded material and have varying mechanical properties throughout, the properties may be optimized and controlled by design. Additionally, the base 404 may be a sacrificial base that is only used in constructing the layer 132 and later removed once the layer is completed.

In a second step 410, graded patches 412 are formed or disposed on the base 404. The graded patches 412 are arranged in the desired pattern in which the thermoelectric elements 122 are arranged. The patches 412 may be made of functionally graded material or other material, such that the patches 412 are stiffer where the thermoelectric elements 122 are placed. Alternatively, if a functionally graded material is used to construct the base 404, the material may be graded to be stiffer in certain areas, thereby forming the patches 412.

In a third step 420, functionally graded material 422 is layered on the base 404 and about the graded patches 412. If the base 404 is sacrificial, the functionally graded material 422 retains the patches 412 in the desired location and arrangements.

In a fourth step 430, traces 432 are formed. The traces 432 are the first set of interconnects that electrically connect the thermoelectric elements 122. The traces 432 may be printed onto the layer using conductive ink, or other suitable methods of forming or disposing the interconnects may be used. The methods used form flexible traces 432 that bend and flex with the device 100 while maintaining the electrical connection between the elements 122.

In the final step 440, the thermoelectric elements 122a and 122b are placed on the patches 412 where they are interconnected by the traces 432. The alternating connection between the p-type conductors 122a and the n-type conductors 122b establishes the electrical connections for the thermoelectric elements to function.

Figure 5A:
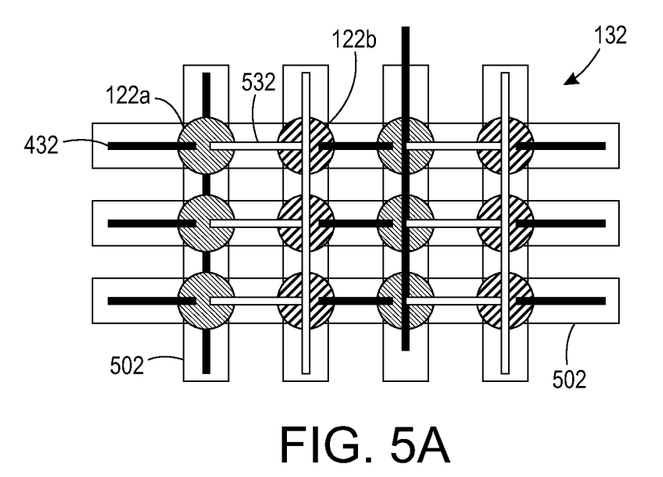
FIGS. 5A and 5B illustrate the details of the interconnected thermoelectric elements on the graded sheet of FIG. 4.
Figure 5B:
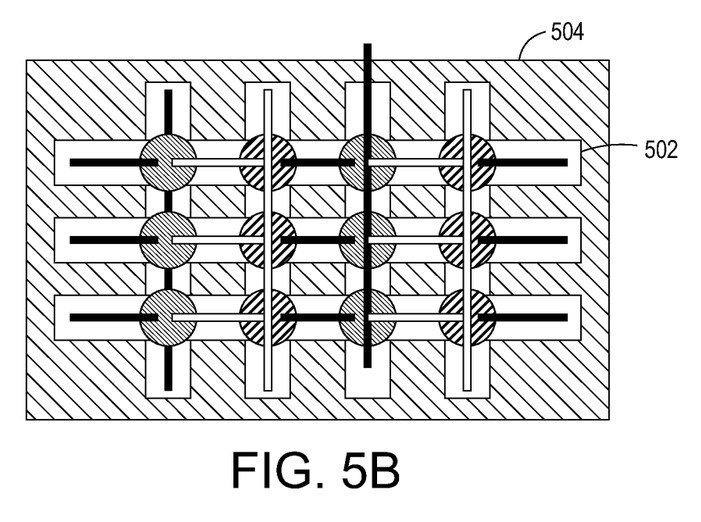

FIGS. 5A and 5B illustrates the thermoelectric elements 122a and 122b arranged on the graded interconnect sheet 132 with the first interconnects 432 and second interconnects 532. In FIG. 5A, the elements 122a and 122b are arranged in a pattern and connected electrically with first and second interconnects 432 and 532. The interconnects follow pathways 502 that may be stiffer than other portions of the sheet to prevent damage to the interconnects as the device 100 flexes. In FIG. 5B, the thermoelectric elements, 122a and 122b, the interconnects, 432 and 532, and the pathways 502 are surrounded in a polymer matrix 504. The polymer 504 may be a functionally graded material.

Figure 6:
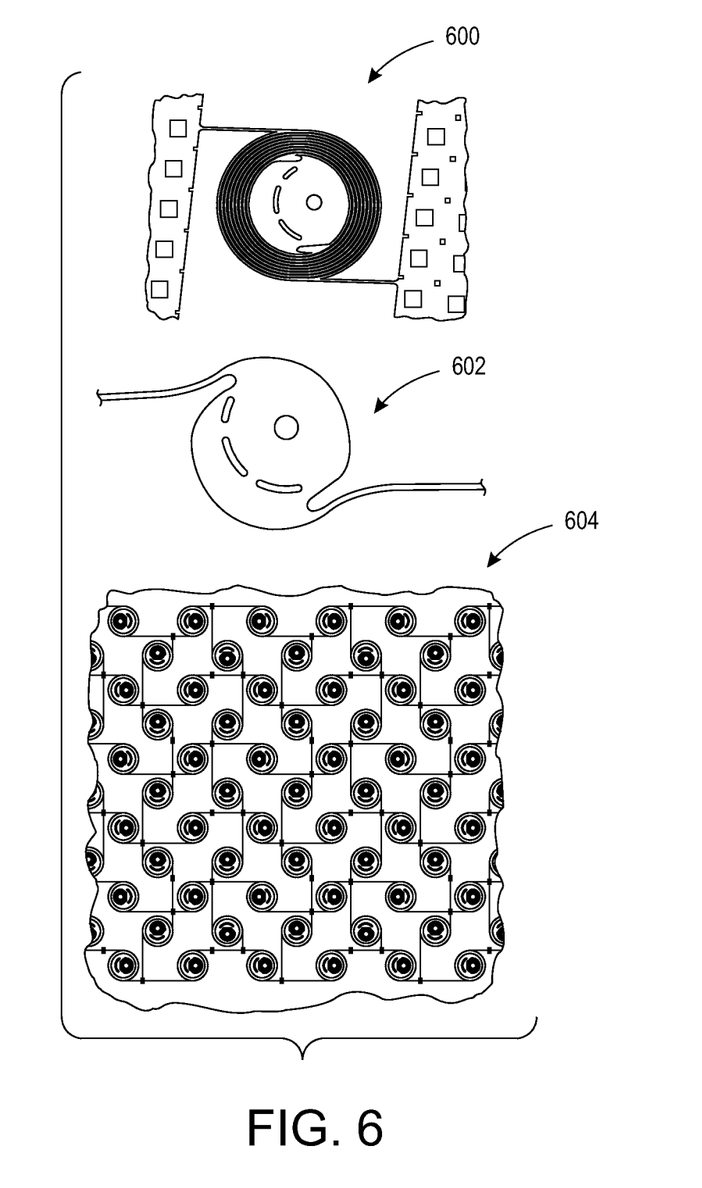
FIG. 6 illustrates an example of a strain absorbing interconnect.

FIG. 6 illustrates an example embodiment of the patches 412 of the graded interconnect layer 132. In the example shown, an ortho-planar spring 600 is used as a strain absorbing structure. The spring unwinds as the device 100 is flexed as shown by 602. The springs 600 may be arranged in an array 604. Each spring 600 of the array 604 has a thermoelectric element disposed on it. The spring 600 provides the first electrical interconnect between the elements 122a and 122b. Alternatively, the elements 122a and 122b may be only disposed on each spring 600 rather than electrically connected. A first set of interconnects may be disposed atop the springs 600 before placement of the elements 122a and 122b. The spring array 602 absorbs strain induced in the device 100. The absorption of the induced strain prevents an undue amount of strain from transferring into the elements 122a and 122b, where they may be damaged by induced strain. The springs 600 may be formed using a printing process that creates the required spring topology on the base layer 402.

In some examples, the thermoelectric elements 122a and 122b are placed on the patches 412 and the first interconnects 432 by a pick-and-place machine or using the roll-to-roll technique. In the roll-to-roll example the thermoelectric elements 122a and 122b are aligned with the patches 412.

Figure 7A:
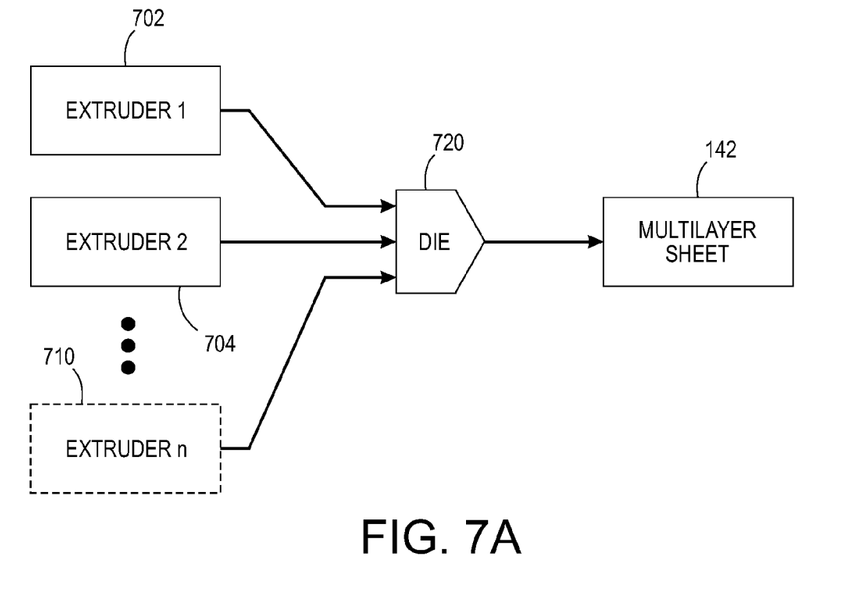
FIG. 7A illustrates an example process for creating a multi-layer thermal layer.

FIG. 7A shows an example process that may be used to create multiplayer thermal layers such as the thermal layer 142. A possible thermal layer is a thermal energy spreading layer that sits above the thermal energy transfer layer and spreads the collected thermal energy about the layer 142.

In the example shown, a first polymer is extruded from a first extruder 702 and a second polymer is extruded from a second extruder 704. The material is then fed into a die 720 that creates a multi-layer sheet 142 composed of the first and second polymer. In order to form the thermal energy spreading layer, one of the polymers has thermally conductive particles that are aligned and arranged as the material is passed through the die 720. Examples of thermally conductive material that may be used include metal nanoparticle, graphene and carbon nanotubes.

Figure 7B:
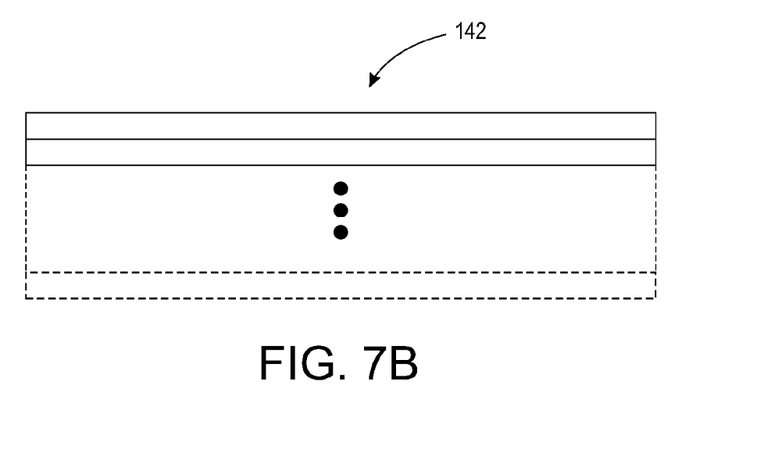
FIG. 7B is a cross-section of the multi-layer thermal layer of FIG. 7A.

Any number of extruders 710 may be used as to create the thermal layer 142. The thermal layer 142 may be formed as a sheet that can be used in the roll-to-roll manufacturing technique. FIG. 7B illustrates a cross-section of the multi-layer sheet 142 formed in FIG. 7A. Alternatively, a functionally graded material or other suitable material may be used to form the sheet 142.

Figure 8:
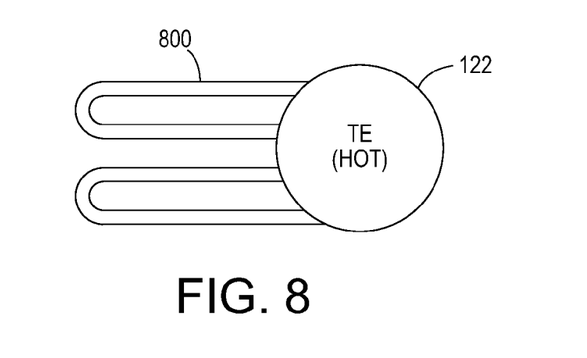
FIG. 8 is an example of a thermal energy spreading element.

FIG. 8 illustrates a flexible heat pipe 800 that can be used in the thermal energy spreading layer. A heat pipe is a sealed device containing a thermal transfer fluid or other substance that is readily vaporized into a gas. The gas then freely flows through the device from a hot source to a cool sink using the created thermal gradient. Thermal energy is transferred from the thermal energy transfer layer 104 into the flexible heat pipe 800 of the thermal energy spreading layer 106, vaporizing the liquid within the heat pipe 800. The heated gas then flows through the heat pipe to a cold source away from the thermoelectric elements of thermal energy transfer layer 104. The heated gas transfers its thermal energy into the thermal exchange layer 108 which acts as a heat sink for the heat pipe 800. The thermal energy transfer from the gas of the heat pipe 800 to the thermal exchange layer 108 recondenses the gas into a liquid that returns to the hot side near the thermoelectric elements. This process is repeated as thermal energy from the thermal energy transfer layer 104 is transferred into the heat pipe 800. The design of the heat pipe 800 creates a passive system that transfers the thermal energy from the thermal energy transfer layer to the thermal energy exchange layer.

The heat pipe 800 is a flexible structure that may be disposed onto a flexible polymer base. The flexible polymer base has similar mechanical strain properties as the other layers of the device. An example of the polymer base layer is one composed of functionally graded material or another flexible polymer. The heat pipe 800 can be a structure created in a separate process and the placed on the base layer or printed or formed directly onto the base layer.

Alternatively, the heat pipe 800 may be a cavity formed in a flexible polymer layer to create the thermal energy spreading layer 106. Such a heat pipe may be constructed using a bi-layer technique. A first base layer is formed and a patterned layer having the heat pipe channels disposed thereon are bonded together to form the structure of the heat pipe 800. Before the layers are bonded, each heat pipe structure 800 is charged with the thermal transfer fluid. The patterned layer can be constructed using a printing technique on a polymer base layer. The bi-layer thermal energy spreading layer 106 is flexible and has similar strain properties as the other layers of the device.

The heat pipe 800 may be produced by a roll-to-roll process to form a roll of base material having heat pipes disposed in a regular and repeating pattern thereon. The roll of heat pipes and base material may then be used in conjunction with the rolls of the other device material for the construction of multiple devices.

Figure 9:
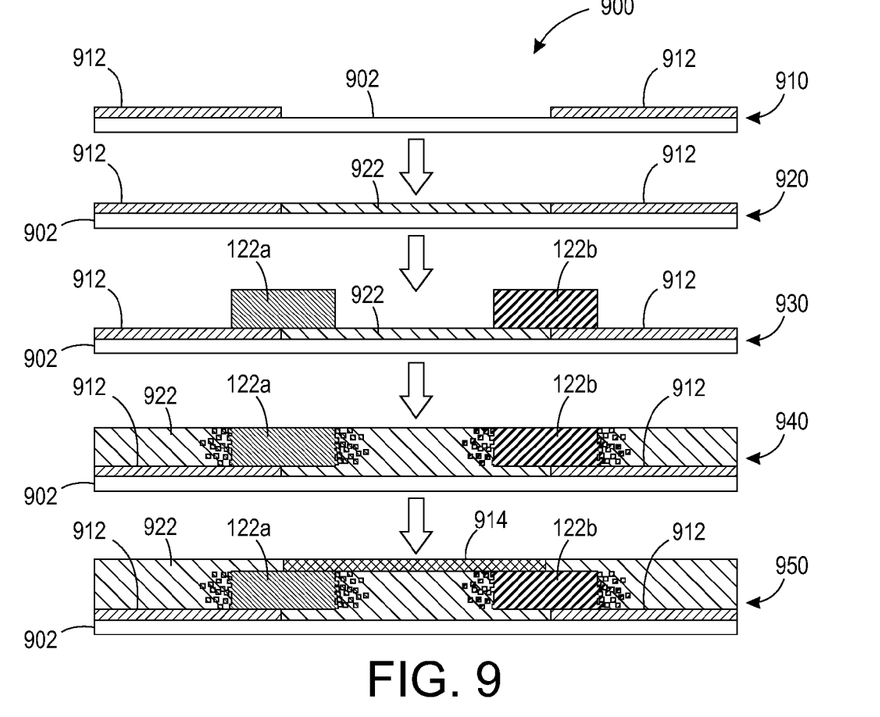
FIG. 9 is an example process of constructing the thermal energy transfer layer.

FIG. 9 illustrates an example method 900 of forming the thermal energy transfer layer 104. In the first step 910, the bottom interconnects 912 are formed on a polymer base 902. The bottom interconnects 912 may be formed on the base layer 902 using a printing or other suitable process.

In the second step 920, functionally graded material 922 is dispensed to fill the space between the interconnects 912. This forms an even base layer to which the thermoelectric elements are affixed.

In the third step 930, the thermoelectric elements 122a and 122b are deposed atop the first interconnects 912. The thermoelectric elements 122a and 122b may be placed automatically by a pick and place machine.

Functionally graded material is then dispensed around the arranged thermoelectric elements in the fourth step 940. The dispensed functionally graded material restrains the arrangement of the thermoelectric elements, 122a and 122b, and the first interconnects 912. The functionally graded material may be manipulated to increase the stiffness of the material about the thermoelectric elements 122a and 122b. Alternatively, the functionally graded material may be graded to have varying mechanical properties as required or desired by the design of the device. A curing process is then performed to bond the thermoelectric elements 122a and 122b, the interconnects 912 and functionally graded material 922 together.

Alternatively, the thermoelectric elements 122a and 122b may be arranged in a sheet of functionally graded material as described above. The sheet containing the thermoelectric elements 122a and 122b is overlaid with the sheet having the interconnects. The alignment of the sheets aligns the thermoelectric elements 122a and 122b with the interconnects 912 and the landing pads, not shown, which may be disposed about the interconnects. The two sheets are then bonded together to form a first set of interconnects 912 having thermoelectric elements 122a and 122b disposed thereon.

Finally, a second interconnect set 914 is then formed or disposed atop the thermoelectric elements 122a and 122b, thereby completing the electrical connections between the thermoelectric elements. A final layer of functionally graded material 922 is then dispensed to complete the layer.

Alternatively, the second interconnects can be created as a separate layer 105 as shown in FIG. 1. The layer containing the second interconnects may then be overlaid on the thermoelectric element. The overlay process may be performed during the integration process that combines the various layers to form completed devices 100.

The polymer base 902 may be kept or removed, as the elements are now held in the proper arrangement and orientation by the functionally graded material matrix surrounding the components.

The completed thermal energy transfer layer may be constructed on a sheet, where the desired interconnects and thermoelectric element patterns are repeated. This sheet may then be used in the integration process to form multiple devices.

Figure 10:
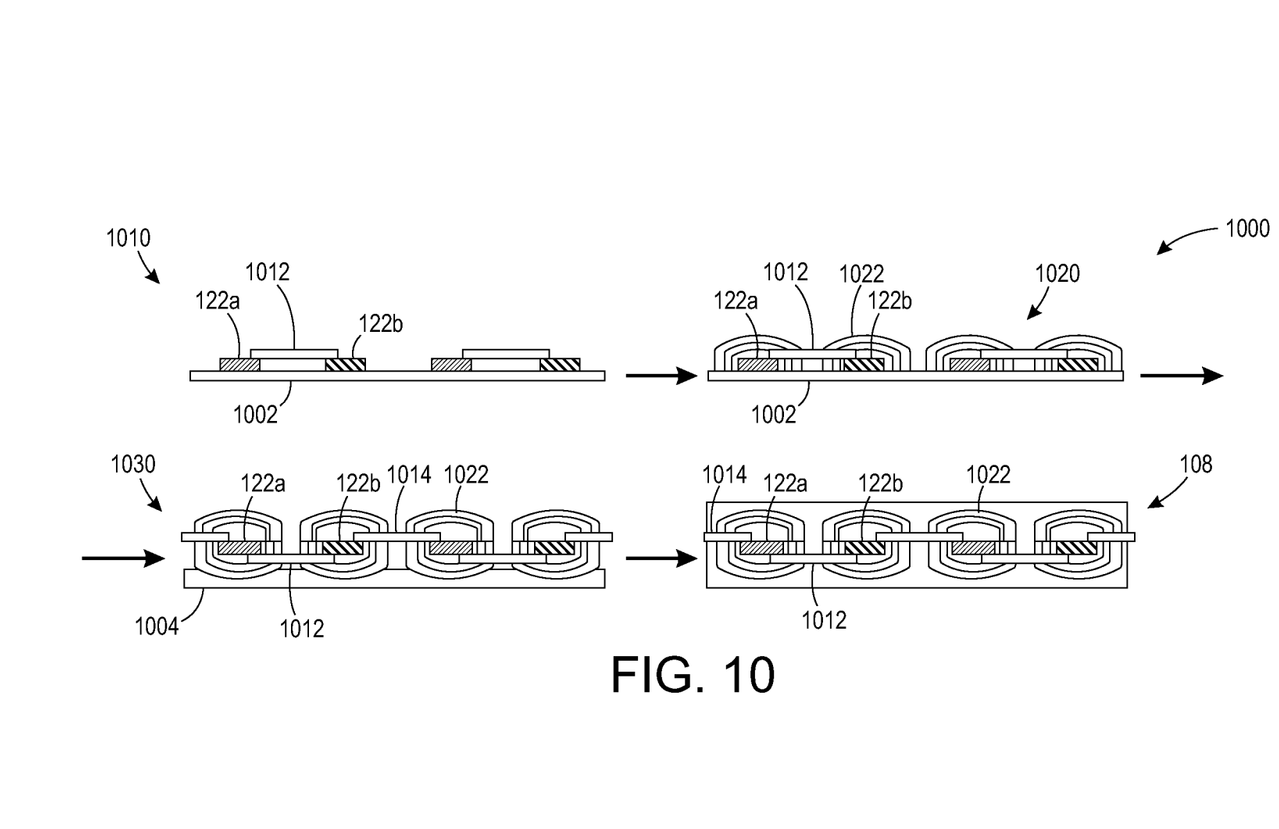
FIG. 10 is another example process of constructing the thermal energy transfer layer.

An alternative process 1000 for forming the thermal energy transfer layer is shown in FIG. 10. The process forms a layer containing the thermoelectric elements and the interconnects, suspended in a functionally graded material.

In the first step, 1010, a first sacrificial substrate 1002 is used as the base onto which the thermal energy transfer layer will be constructed. The thermoelectric elements 122a and 122b are arranged on the substrate. In the embodiment shown, the elements 122a and 122b are not coated in functionally graded material and are deposited using a screen printing technique. Other techniques for depositing the elements 122a and 122b in an arrangement on the base 1002 may be used. Additionally, the elements may be coated in functionally graded material as disclosed above.

Stretchable conductors are placed atop the thermoelectric elements 122a and 122b to form a first set of interconnects 1012. The first interconnects 1012 electrically connect the elements 122a and 122b and define a first side of the elements.

The second step 1020 layers functionally graded material 1022 about the thermoelectric elements 122a and 122b. The functionally graded material 1022 has varying mechanical properties about the thermoelectric elements 122a and 122b. The first interconnects 1012 are bonded to the elements 122a and 122b by the dispensed functionally graded material.

A second sacrificial substrate 1004 is then placed across the top of the functionally graded material and the layer as it is currently constructed is flipped. The first sacrificial substrate 1002 is removed exposing a second side of the thermoelectric elements 122a and 122b.

In the step 1030, a set of second interconnects 1014 are disposed on the second side of the thermoelectric elements 122a and 122b. The layering of functionally graded material is then repeated, the functionally graded material bonds the second interconnects 1014 to the second side of the thermoelectric elements 122a and 122b.

The second substrate 1004 is then removed leaving the arrangement of functionally graded material coated thermoelectric elements 122a and 122b joined by first and second stretchable interconnects 1012 and 1014. Voids exist between the various thermoelectric elements. A flexible polymer, such as functionally graded material or a stretchable polymer is dispensed to fill the voids to complete the thermal energy transfer layer.

The thermal energy transfer layer may be constructed in a sheet form having multiple repeated patterns of thermoelectric elements and interconnects. The sheet may then be overlaid and integrated with the other device layers to form a sheet having multiple devices disposed thereon.

The thermal exchange layer 108 may be formed using similar techniques as the other layers. The thermal exchange layer 108 features thermally conductive structures that increase the surface area of the layer, thereby increasing the convective capability of the layer to dissipate thermal energy from the device. The layer 108 is constructed of a thermally conductive flexible polymer, with the thermally conductive structures disposed on, constructed on, or constructed from the polymer base. An example process for forming the structure is the use of an electrohydrodynamic process that shapes the thermally conductive polymer into the desired shape.

The adhesive layer 102 can be a flexible polymer having an adhesive disposed thereon. The adhesive layer 102 affixes the device 100 to a user's skin. Additionally in some examples, the adhesive layer 102 includes thermally conductive elements that assist with the transfer of thermal energy from a user into the device 100. Further, the adhesive layer 102 may feature wicking elements that are constructed to remove built-up moisture that may be trapped between the device 100 and the user's skin. An example of a wicking element may be pores that traverse at least a portion of the thickness of the device. The pores allow moisture to be transferred into or through the device and away from the user. The removal of such moisture increases user comfort while wearing the device and assists with the retaining of the device against a user's skin.

The protective layer 110 is constructed as a flexible layer that provides environmental protection to the device. This layer may be overlaid with the other layers during the integration process or may be applied to the device after it has been formed from the other layers. The protective layer 110 may also be a polymeric coating that is applied to the devices after they have been formed from the other layers.

Using roll-to-roll manufacturing and other techniques, the various layers may be constructed as large sheets or rolls that have repeated components and/or patterns. These sheets may then be overlaid and integrated to form a single large sheet from which individual devices may be cut or punched. The independent creation of the various layers of the device allows for the rapid and efficient manufacture of multiple devices.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A method of manufacturing an active temperature control device, comprising:
    forming thermoelectric elements;
    forming a thermal energy transfer layer of interconnected thermoelectric elements integrated in functionally graded material;
    forming a thermal exchange layer configured to exchange thermal energy with the thermal energy transfer layer; and
    integrating the thermal energy transfer layer and the thermal exchange layer to be in thermal communication with each other.

2. A method of manufacturing the active temperature control device of claim 1, wherein forming the thermoelectric elements, comprises:
    forming an extrusion of a semiconductor material;
    applying at least a coating of functionally graded material to the extrusion;
    cutting the coated extrusion into cross-sections to form thermoelectric elements, the thermoelectric elements having an exposed cross-section of semiconductor material surrounded by at least a layer of functionally graded material.

3. A method of manufacturing the active temperature control device of claim 1, wherein forming the thermal energy transfer layer, comprises:
   forming a functionally graded sheet having interconnect circuitry disposed thereon;
   placing thermoelectric elements on the interconnect circuitry of the functionally graded material;
   surrounding the periphery of the thermoelectric elements with functionally graded material;
   forming interconnects above the thermoelectric elements; and
   applying functionally graded material about the interconnects, the thermoelectric elements electrically connected and integrated into a functionally graded material.

4. A method of manufacturing the active temperature control device of claim 1, wherein forming the thermal energy transfer layer, comprises:
   forming first interconnects spaced apart;
   depositing a first layer of functionally graded material in the spaces around the first interconnects;
   disposing spaced apart thermoelectric elements on the first interconnects, the thermoelectric elements electrically coupled to the first interconnects;
   depositing a second layer of functionally graded material about the periphery of the thermoelectric elements;
   disposing second interconnects on the thermoelectric elements, the thermoelectric elements electrically coupled to the second interconnects;
   depositing a third layer of functionally graded material about the second interconnects.

5. A method of manufacturing the active temperature control device of claim 4, wherein the first interconnects are formed on functionally graded substrate.

6. A method of manufacturing the active temperature control device of claim 1, wherein forming the thermal exchange layer comprises forming a layer of functionally graded, thermally conductive material.

7. A method of manufacturing the active temperature control device of claim 1, wherein forming the thermal exchange layer, comprises:
   forming a base;
   forming a flexible heat pipe disposed on the base; and
   forming a textured thermally conductive polymer layer in thermal communication with the heat pipe.

8. A method of manufacturing the active temperature control device of claim 1, wherein the thermal exchange layer is a thermally conductive polymer having a first textured surface.

9. A method of manufacturing the active temperature control device of claim 8, wherein the texturing of the thermally conductive polymer is formed using an electrohydrodynamic film patterning process.

10. A method of manufacturing the active temperature control device of claim 1, wherein integrating the thermal energy transfer layer and the thermal exchange layer, comprises thermally bonding the layers.

11. A method of manufacturing the active temperature control device of claim 1, further comprising:
   forming an adhesive layer; and
   integrating the adhesive layer, the thermal energy transfer layer and the thermal exchange layer to be in thermal communication with each other.

12. A method of manufacturing the active temperature control device of claim 1, further comprising:
   forming a protective layer; and
   integrating the protective layer, the thermal energy transfer layer and the thermal exchange layer.

13. A method of manufacturing an active temperature control device, comprising:
   forming an extrusion of thermoelectric material;
   applying at least a layer of functionally graded material to the extrusion of thermoelectric material;
   cross-sectioning the layered extrusion to form thermoelectric elements;
   arranging the thermoelectric elements in a layout pattern;
   depositing material about the periphery of the thermoelectric elements to form a thermoelectric layer;
   forming a flexible interconnect layer;
   disposing compliant structures on the interconnect layer in the layout pattern;
   forming first interconnects on the flexible interconnect layer;
   placing the thermoelectric layer on the interconnect layer, the thermoelectric elements disposed atop the compliant structures and electrically coupled to the first interconnects;
   disposing second interconnects on the thermoelectric elements, the second interconnects electrically coupling the thermoelectric elements;
   depositing functionally graded material about the second interconnects;
   forming a thermal energy transfer layer having electrically interconnected thermoelectric elements disposed in a functionally graded material and disposed atop a flexible interconnect layer having compliant structures arranged with the thermoelectric elements;
   forming a thermal spreading layer having at least a thermally conductive feature disposed in a functionally graded material;
   forming a thermally conductive polymer;
   texturing the thermally conductive polymer;
   integrating the textured thermally conductive polymer and thermal spreading layer to form a thermal energy exchange layer; and
   integrating the thermal energy exchange layer and the thermal energy transfer layer.

14. A method of manufacturing an active temperature control device, comprising:
   forming a user interface layer;
   forming a thermal energy transfer layer having thermoelectric elements disposed thereon in a functionally graded material
   forming a thermal spreading layer;
   forming a thermal exchange layer;
   forming a protective layer; and
   integrating the user interface layer, the thermal energy layer, the thermal spreading layer, the thermal exchange layer and the protective layer.

* * * * *